US008837165B2

(12) United States Patent
Yang

(10) Patent No.: US 8,837,165 B2
(45) Date of Patent: Sep. 16, 2014

(54) ELECTRONIC DEVICE WITH BUTTON

(75) Inventor: Xin Yang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 387 days.

(21) Appl. No.: 13/267,904

(22) Filed: Oct. 7, 2011

(65) Prior Publication Data

US 2013/0021770 A1 Jan. 24, 2013

(30) Foreign Application Priority Data

Jul. 22, 2011 (CN) ............................ 2011 1 020662

(51) Int. Cl.

*H05K 7/02* (2006.01)
*H05K 7/04* (2006.01)
*H01H 13/50* (2006.01)
*H01H 3/12* (2006.01)

(52) U.S. Cl.

CPC .................................... *H01H 3/122* (2013.01)
USPC ....................... 361/807; 361/679.58; 200/344

(58) Field of Classification Search

USPC ........ 361/600, 679.01, 807, 679.58; 200/344, 200/345, 296, 339
See application file for complete search history.

(56) References Cited

U.S. PATENT DOCUMENTS

| | | | | |
|---|---|---|---|---|
| 5,990,435 | A * | 11/1999 | Chao | 200/517 |
| 6,057,522 | A * | 5/2000 | Chao | 200/344 |
| 7,462,796 | B1 * | 12/2008 | Chai | 200/341 |
| 8,109,541 | B2 * | 2/2012 | Chang et al. | 361/679.58 |
| 8,184,095 | B2 * | 5/2012 | Pan et al. | 361/807 |
| 8,546,714 | B2 * | 10/2013 | Zhang et al. | 200/344 |
| 2009/0321241 | A1 * | 12/2009 | Zhen | 200/532 |
| 2013/0020185 | A1 * | 1/2013 | Zhang et al. | 200/344 |

* cited by examiner

*Primary Examiner* — Bernard Rojas
(74) *Attorney, Agent, or Firm* — Novak Druce Connolly Bove + Quigg LLP

(57) ABSTRACT

An electronic device includes a panel, a base, a button, and a balance bar. The panel defines an opening. The base is fixed to a rear side of the panel. A switch and a resilient resisting portion are mounted to a front surface of the base. The button is sandwiched between the panel and the base. The button is partially received in the opening. Two pivot portions are formed a rear side of the button. The balance bar includes a first bar abutting against the resisting portion, two second bars respectively extending from opposite ends of the first bar, and two feet respectively extending from distal ends of the second bars to pivotably connect the pivot portions. When the button is pressed, the balance bar restricts the button to just move linearly to the switch.

7 Claims, 5 Drawing Sheets

ELECTRONIC DEVICE WITH BUTTON

CROSS-REFERENCE TO RELATED APPLICATION

Relevant subject matter is disclosed in a U.S. patent application, entitled "BUTTON ASSEMBLY AND ELECTRONIC DEVICE HAVING THE SAME", and filed on Sep. 18, 2011, with the application Ser. No. 13/235447, which is assigned to the same assignee as this patent application.

BACKGROUND

1. Technical Field

The present disclosure relates to an electronic device with a button.

2. Description of Related Art

An electronic device generally includes a button, such as a power button. However, if a button is too long, it can become tilted when pressed, and not properly press a switch associated with the button.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
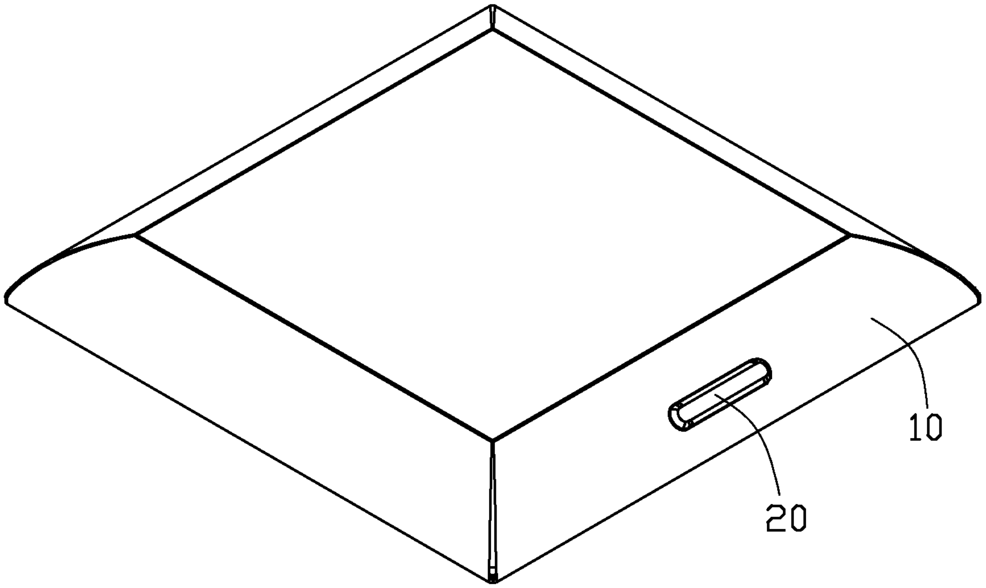
FIG. 1 is an assembled, isometric view of an exemplary embodiment of an electronic device.
Figure 2:
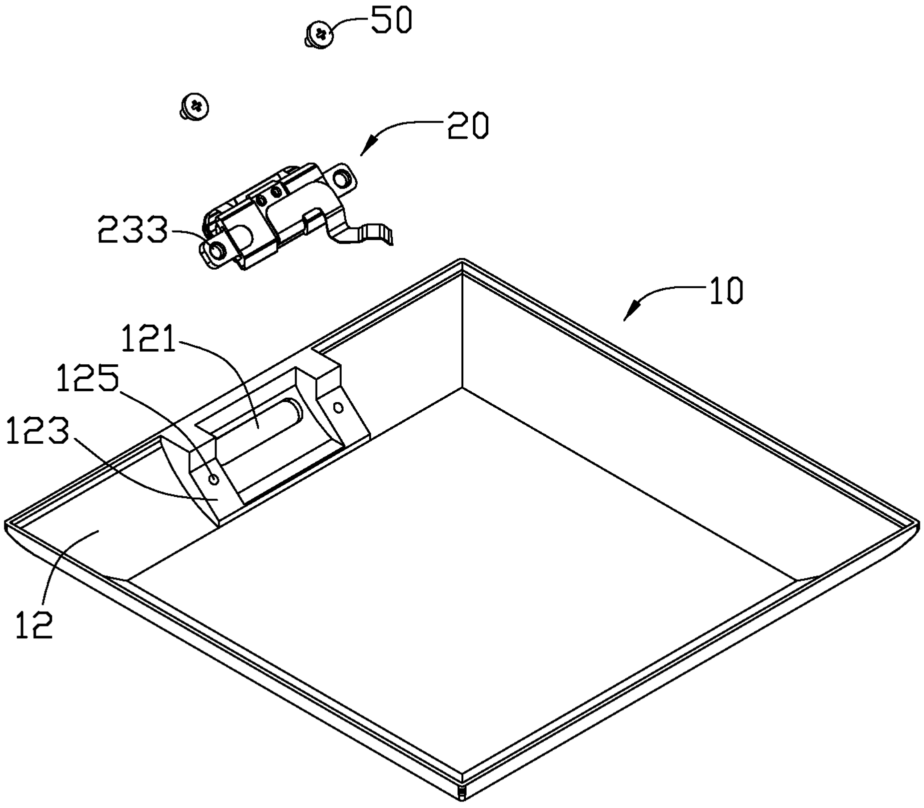
FIG. 2 is an inverted, exploded, isometric view of FIG. 1, wherein the electronic device includes an enclosure, and a button assembly.

Referring to FIGS. 1 and 2, an exemplary embodiment of an electronic device includes an enclosure 10, and a button assembly 20.

The enclosure 10 includes a panel 12. An elongated opening 121 is defined in the panel 12. Two blocks 123 extend rearwards from a rear side of the panel 12, respectively adjacent to opposite ends of the opening 121. A threaded hole 125 is defined in each block 123.

Figure 3:
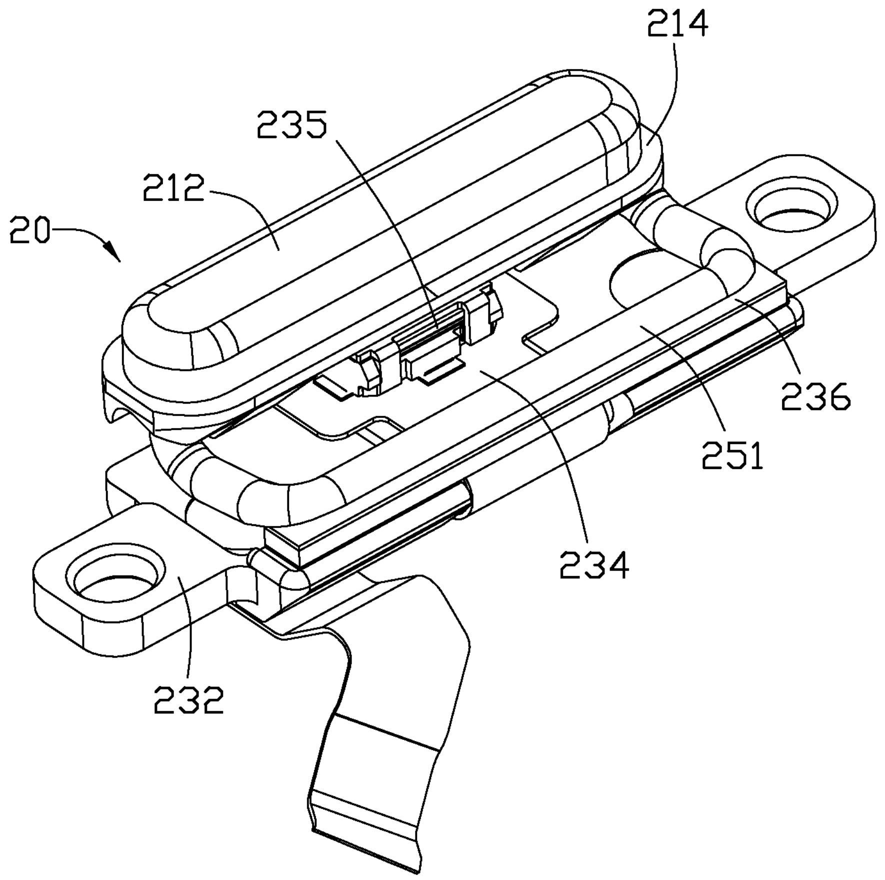
FIG. 3 is an inverted view of the button assembly of FIG. 2.
Figure 4:
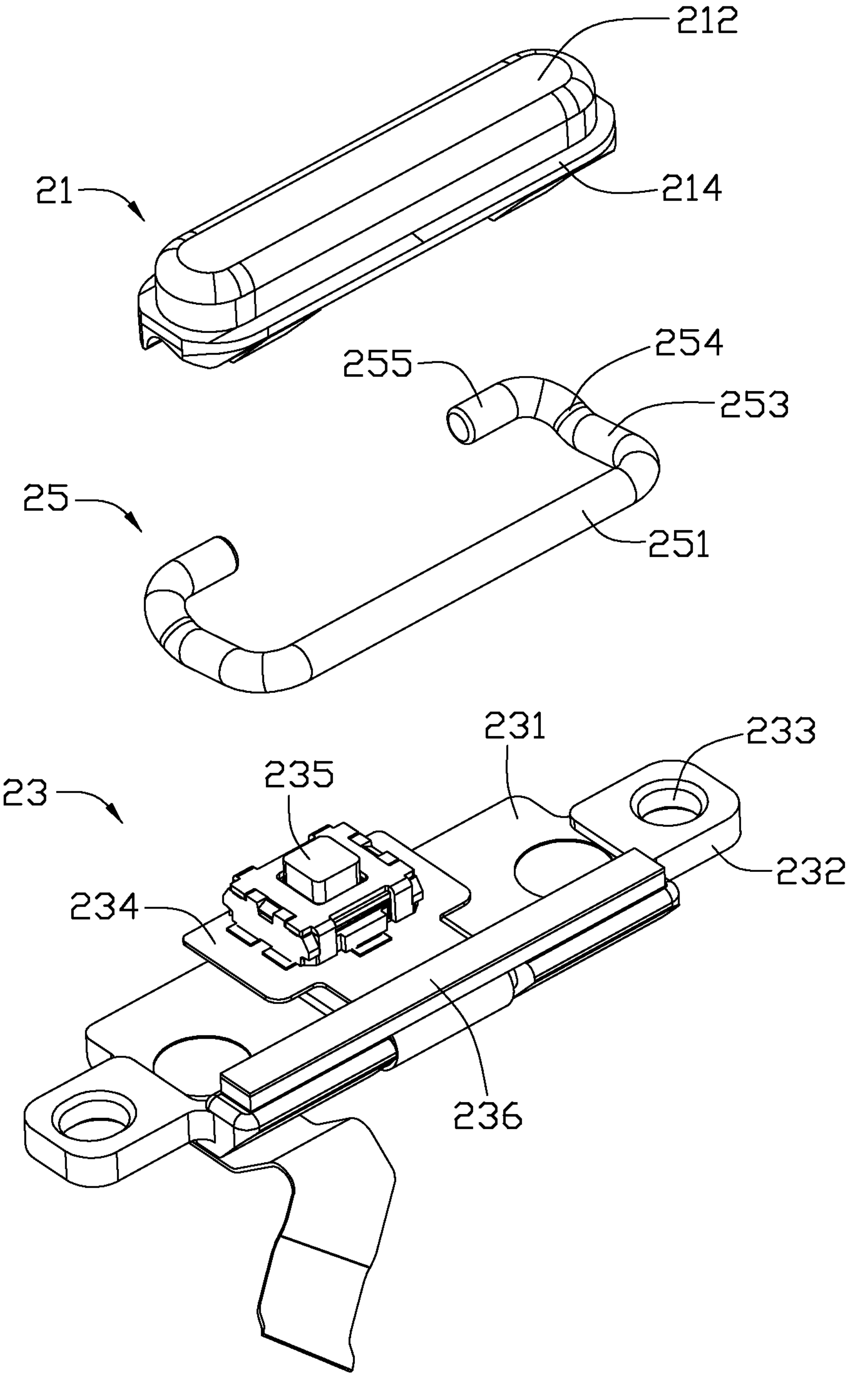
FIG. 4 is an exploded, isometric view of the button assembly of FIG. 3.
Figure 5:
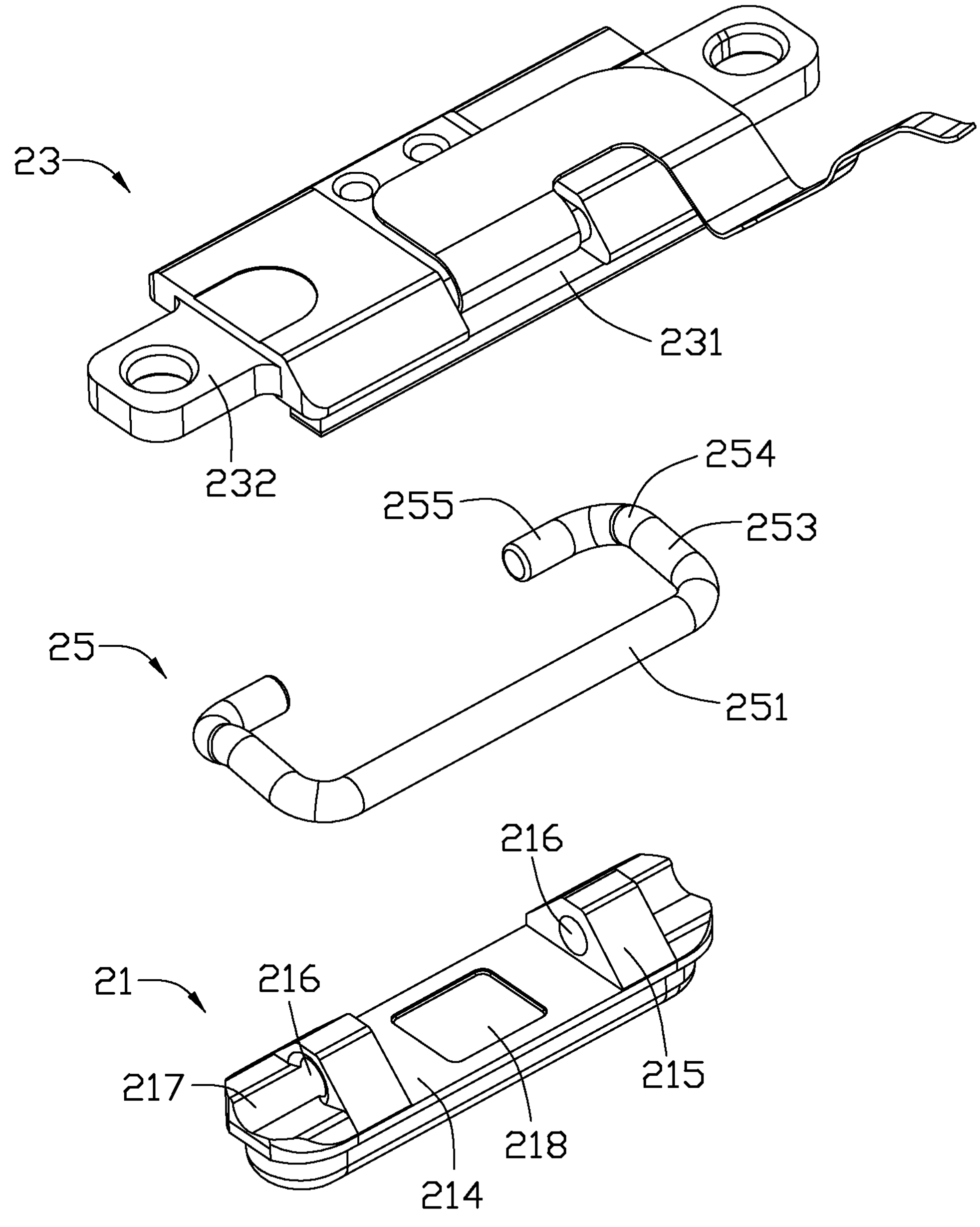
FIG. 5 is an inverted view of FIG. 4.

Referring to FIGS. 3 to 5, the button assembly 20 includes a button 21, a base 23, and a balance bar 25.

The button 21 includes an elongated bottom plate 214, and an elongated main body 212 extending forwards from a front surface of the bottom plate 214. Two pivot portions 215 are formed on the central axis of a rear surface of the bottom plate 214, respectively adjacent to opposite ends of the bottom plate 214. Two coaxial pivot holes 216 are respectively defined in the pivot portions 215. Two recesses 217 are defined in the central axis of the rear surface of the bottom plate 214, with opposite ends of each recess 217 extending through the corresponding pivot hole 216 and the corresponding end of the bottom plate 214, respectively. A concave press portion 218 is formed on a middle of the rear surface of the bottom plate 214.

The base 23 includes a substantially rectangular plate 231. Two tabs 232 extend outwards from opposite ends of the plate 231, respectively. A through hole 233 is defined in each tab 232. A circuit board 234 is mounted to a middle of a front surface of the plate 231. A switch 235 is mounted on the circuit board 234. An elongated resilient resisting portion 236 is longitudinally fixed to the front surface of the plate 231. In the embodiment, the resisting portion 236 is made of foam rubber.

The balance bar 25 is substantially U-shaped, and includes a first bar 251, two second bars 253 respectively extending outwards from opposite ends of the first bar 251, and two feet 255 extending toward each other from distal ends of the second bars 253 away from the first bar 251. A concave portion 254 is formed on each second bar 253 adjacent to the corresponding foot 255.

Referring to FIG. 2, in assembly, the second bars 253 are deformed away from each other, to allow the feet 255 to be received in the recesses 217, respectively. The second bars 253 are restored, to allow the feet 255 to pivotably engage in the pivot holes 216, respectively. The concave portions 254 fittingly engage with the rear surface of the bottom plate 214. The main body 212 is inserted into the opening 121, with a front surface of the main body 212 exposed out of the front surface of the panel 12. The bottom plate 214 engages with the rear side of the panel 12 around the opening 121. Two screws 50 are respectively extended through the through holes 233 and engage in the corresponding threaded holes 125, to fix the base 23 to the rear side of the panel 12. Thereby, the button 21 is sandwiched between the panel 12 and the base 23. The switch 235 aligns with and is spaced from the press portion 218. The first bar 251 abuts against and deforms the resisting portion 236.

In use, no matter which portion of the front surface of the main body 212 is pressed, the balance bar 25 restricts the button 21 to move linearly, therefore the press portion 218 will correctly press the switch 235. In the process, the balance bar 25 is deformed, and the feet 255 are rotated in the corresponding pivot holes 216 and recesses 217. The first bar 251 continuously abuts against the resisting portion 236, and more efficiently prevents the button 21 from being tilted.

When the button 21 is released, the balance bar 25 is restored to allow the feet 255 to push the button 21 forwards until the bottom plate 214 engages with the rear side of the panel 12 around the opening 121.

Even though numerous characteristics and advantages of the embodiments have been set forth in the foregoing description, together with details of the structure and the functions of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. An electronic device, comprising:

a panel defining an opening;

a base fixed to a rear side of the panel, a switch and a resilient resisting portion mounted to a front surface of the base;

a button sandwiched between the panel and the base, the button comprising a main body extending through the opening of the panel, and a bottom plate formed on a rear side of the main body, a press portion formed on a middle of a rear surface of the bottom plate aligning with and spaced from the switch, and two pivot portions formed on the rear surface of the bottom plate respectively adjacent to opposite ends of the bottom plate; and a balance bar comprising a first bar abutting against the resisting portion, two second bars respectively extending from opposite ends of the first bar, and two feet respectively extending from distal ends of the second bars away from the first bar, wherein the feet are pivotably connected to the pivot portions of the button, respectively, when the button is pressed rearwards, the balance bar restricts the button to move linearly to the switch.

2. The electronic device of claim 1, wherein the resisting portion is made of foam rubber.

3. The electronic device of claim 2, wherein two blocks extend rearwards from the rear side of the panel, respectively adjacent to opposite ends of the opening, two tabs are formed on opposite ends of the base and are fixed to the blocks, respectively.

4. The electronic device of claim 3, wherein a threaded hole is defined in each block, a through hole is defined in each tab, two screws are respectively extended through the through holes and engage in the threaded holes, to fix the base to the panel.

5. The electronic device of claim 2, wherein the bottom plate engages with the rear side of the panel around the opening.

6. The electronic device of claim 5, wherein the pivot portions are formed on a central axis of the rear surface of the bottom plate, two coaxial pivot holes are respectively defined in the pivot portions, to pivotably receive the feet of the balance bar, respectively.

7. The electronic device of claim 6, wherein the feet extend toward each other, two recesses are defined in the central axis of the rear surface of the bottom plate, with opposite ends of each recess extending through the corresponding pivot hole and the corresponding end of the bottom plate, respectively, the feet are rotatably received in the recesses and rotatably engage in the corresponding pivot holes.

* * * * *